United States Patent
Kuo et al.

(10) Patent No.: US 7,316,240 B2
(45) Date of Patent: Jan. 8, 2008

(54) EXHAUST SYSTEM AND MINI-EXHAUST STATIC PRESSURE CONTROLLING APPARATUS THEREOF

(75) Inventors: Po-Sung Kuo, Tainan (TW); Yung-Dar Chen, Hsinchu (TW); Dar-Rung Kuo, Taipei (TW); Ming-Chien Wen, Hsinchu (TW); Ming-Tsong Wang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 93 days.

(21) Appl. No.: 11/110,779

(22) Filed: Apr. 21, 2005

(65) Prior Publication Data

US 2006/0237073 A1    Oct. 26, 2006

(51) Int. Cl.
*F16K 15/14* (2006.01)
(52) U.S. Cl. .................... 137/14; 137/854; 251/337
(58) Field of Classification Search ........... 137/854, 137/14; 251/331, 337
See application file for complete search history.

(56) References Cited

U.S. PATENT DOCUMENTS 3,610,273 A * 10/1971 Russell .................. 137/513.3
5,979,480 A * 11/1999 Hoshiko .................. 137/14
6,065,493 A * 5/2000 Friedman et al. ...... 137/512.15
6,129,116 A * 10/2000 Laskowski ............... 137/854

FOREIGN PATENT DOCUMENTS

| JP | 05160071 A | * | 6/1993 |
| JP | 07066183 A | * | 3/1995 |
| JP | 2001-216031 | * | 8/2001 |

* cited by examiner

*Primary Examiner*—Ramesh Krishnamurthy
(74) *Attorney, Agent, or Firm*—Birch, Stewart, Kolasch & Birch, LLP

(57) ABSTRACT

An exhaust system and a mini-exhaust static pressure controlling apparatus thereof for controlling a process area. The mini-exhaust static pressure controlling apparatus has an exhaust chamber and an auto release damping device. The exhaust chamber has an air inlet connected to the process area receiving air exhaust from the process area, and an air outlet venting the air exhaust. The auto release damping device has a diaphragm pre-stressed in an arc shape with a coefficient of elasticity and an adjusting device for applying a stress on the diaphragm to maintain the arc shape of the diaphragm, and is disposed on the exhaust chamber to control static pressure of the air exhaust in the exhaust chamber.

9 Claims, 3 Drawing Sheets

EXHAUST SYSTEM AND MINI-EXHAUST STATIC PRESSURE CONTROLLING APPARATUS THEREOF

BACKGROUND

The present invention relates to an exhaust system and a mini-exhaust static pressure controlling apparatus thereof.

In a semiconductor foundry, it is important to keep the environmental conditions under control. Airborne molecular contaminations (AMCs) such as articles and other floating dirt can be harmful to the environmental conditions and should be maintained under a preferred level.

Generally, the AMCs can be categorized to two types, i.e. the environmental contamination and the tool contamination. Conventionally, a filtration system, such as an exhaust system, can be applied in the foundry to reduce the tool contamination. The conventional exhaust system provides capability to draw out pollution from the tools.

An example of the conventional exhaust system is described with respect to FIG. 1. In FIG. 1, a process area 50 is provided with tools and machines disposed therein. In the process area 50, a plurality of fans 52 can be disposed at the inlets thereof, and a mass flow control valve 110 is provided at the outlet thereof. The mass flow control valve 110 can be formed with a throttle, a vacuum diffuser, or a piston. The air inlet of the mass flow control valve 110 is ducted to the process area 50, in which the tools and machines are disposed, for reducing tool contamination. The pressure in the mass flow control valve 110 can be set under room air pressure by the piston, and the throttle and the vacuum diffuser turn on and off such that the piston floats, ensuring a closed-type space for the mass flow control valve 110. Further, pressure in the valve 110 can be increased so that the high-pressure setting improves exhaust outward performance and capability of the exhaust system.

In the conventional exhaust system, however, the mass flow control valve 110 is a closed-type valve with all elements sealed inside the valve. Accordingly, adjustment of the elements is predetermined and difficult to refine, and maintenance for the valve is difficult. Further, the high-pressure setting of the mass flow control valve 110 has an impact to operation of the tools and machines in the process area 50, which might be hazardous in the long-term manufacture.

Conventionally, a chemical filter can be employed in the exhaust system to reduce the tool contamination and improve the performance thereof. In this case, however, cost of the exhaust system is increased.

SUMMARY

Accordingly, an embodiment of the invention provides a mini-exhaust static pressure controlling apparatus for controlling a process area. The mini-exhaust static pressure controlling apparatus has an exhaust chamber and an auto release damping device. The exhaust chamber has an air inlet connected to the process area receiving air exhaust from the process area, and an air outlet venting the air exhaust. The auto release damping device has a diaphragm pre-stressed in an arc shape with a coefficient of elasticity and an adjusting device for applying a stress on the diaphragm to maintain the arc shape of the diaphragm, and is disposed on the exhaust chamber to control static pressure of the air exhaust in the exhaust chamber.

Another embodiment of the invention discloses an exhaust system in a foundry. The exhaust system has a process area comprising a tool disposed therein, an exhaust inlet, and an exhaust outlet, and the above-mentioned mini-exhaust static pressure controlling apparatus disposed at the exhaust outlet.

A further embodiment of the invention discloses a method of static pressure controlling for a process area. An exhaust chamber is provided at an exhaust outlet of the process area, receiving air exhaust from the process area. An auto release damping device is provided on the exhaust chamber, the auto release damping device comprising a diaphragm pre-stressed in an arc shape with a coefficient of elasticity and an adjusting device for applying a stress on the diaphragm to maintain the arc shape of the diaphragm. By adjusting the adjusting device, static pressure of the air exhaust in the exhaust chamber is controlled.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art front this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION

An embodiment of the invention can be described in detail with reference to FIG. 2.

Figure 1:
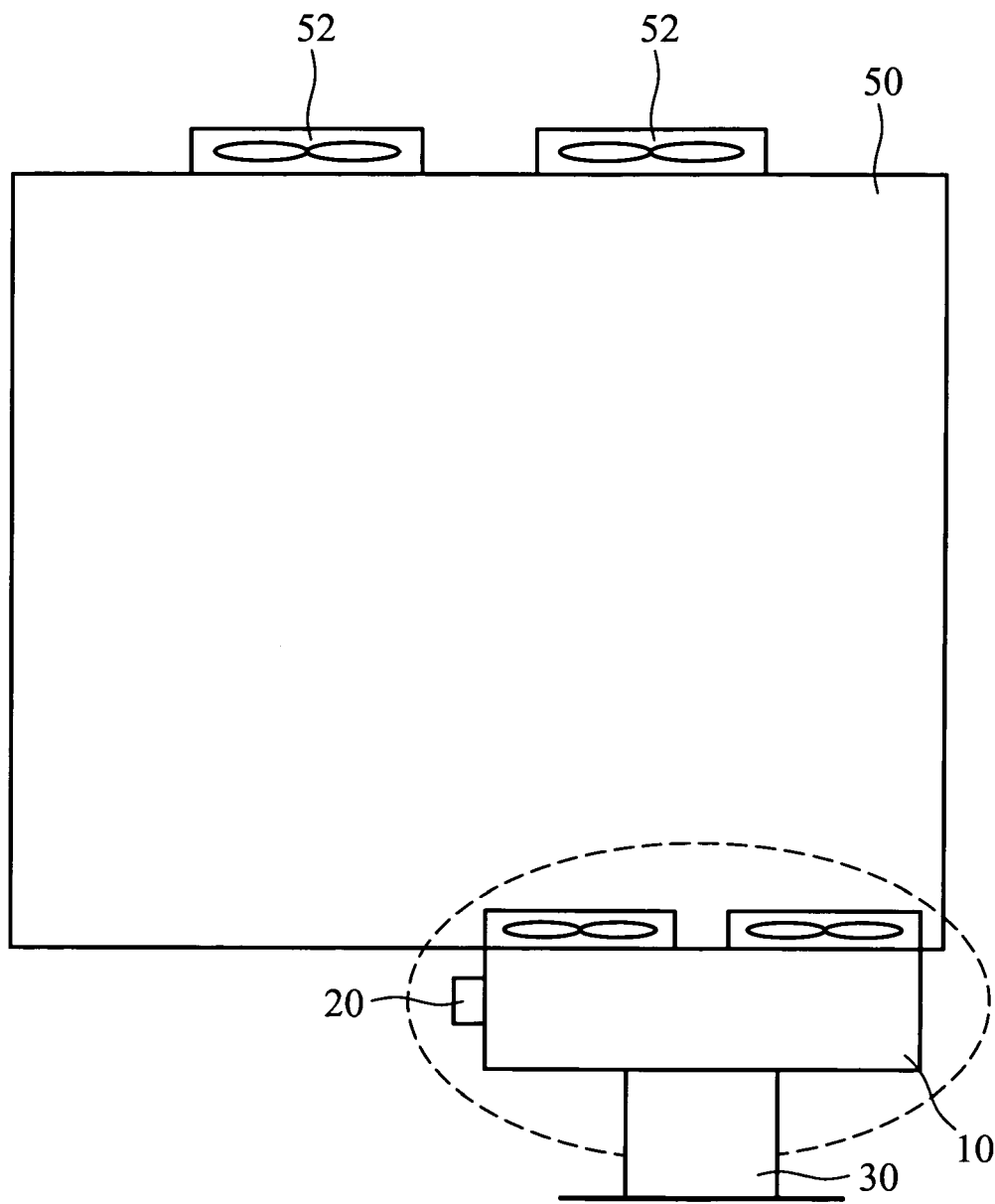
FIG. 1 is a schematic view of a mass flow control valve forming a conventional exhaust system.
Figure 2:
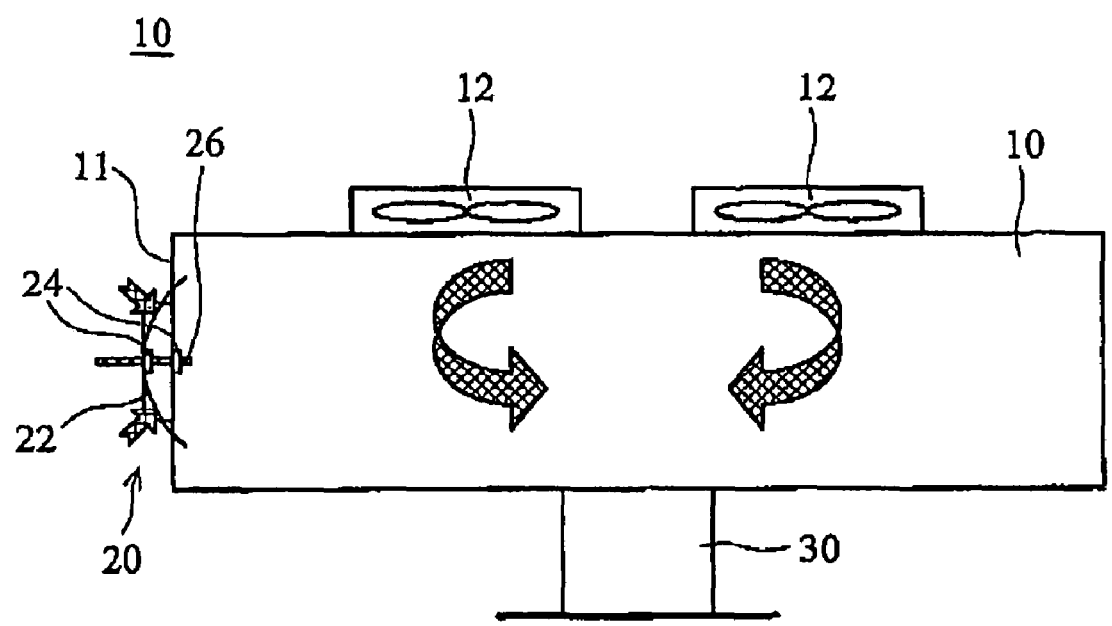
FIG. 2 is a schematic view of a mini-exhaust static pressure controlling apparatus of an embodiment.

FIG. 2 shows a mini-exhaust static pressure controlling apparatus of the embodiment. The mini-exhaust static pressure controlling apparatus has an exhaust chamber 10 and an auto release damping device 20. The exhaust chamber 10 has an exterior wall 11, an air inlet and an air outlet 30. The air inlet, where a plurality of fans 12 are disposed, is connected to the process area 50 as shown in FIG. 1, receiving air exhaust from the process area 50. The air outlet 30 vents the air exhaust in the exhaust chamber 10. The auto release damping device 20 is disposed on the exterior wall 11 of the exhaust chamber 10 to control static pressure of the air exhaust in the exhaust chamber 10.

Figure 3:
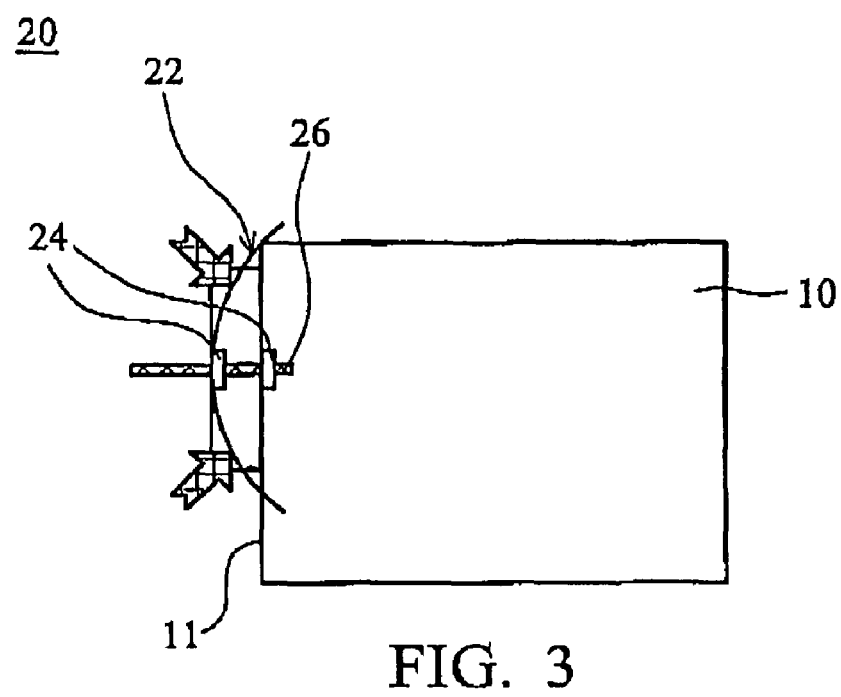
FIG. 3 is a schematic view of an auto release damping device of the mini-exhaust static pressure controlling apparatus in FIG. 2.

FIG. 3 shows the auto release damping device 20. The auto release damping device 20 has a diaphragm 22 arid an adjusting device. The diaphragm 22 is pre-stressed in an arc shape with a coefficient of elasticity. The adjusting device is between the diaphragm 22 and the exterior wall 11 as a connection therebetween. The adjusting device is formed by a screwing device 26 with a plurality of nuts 24 thereon to apply a stress on the diaphragm 22 to maintain the arc shape of the diaphragm 22.

Specifically, the exhaust chamber 10 is provided at an exhaust outlet of the process area 50, receiving air exhaust from the process 50. The auto release damping device 20 is provided on the exhaust chamber 10. The diaphragm 22 of the auto release damping device is pre-stressed in an arc shape with a coefficient of elasticity, and the adjusting device is employed for applying a stress on the diaphragm 22 to maintain the arc shape of the diaphragm 22. Thus, by adjusting the adjusting device, static pressure of the air exhaust in the exhaust chamber 10 can be controlled.

It should be mentioned that, the auto release damping device 20 is disposed on the exhaust champer 10 and exposed to the environment. Thus, the exhaust champer 10 can be maintained closed in adjusting of the auto release damping device 20. Since the arc shape of the diaphragm 22 is set to keep the coefficient of elasticity of the diaphragm 22, a balanced environment can be formed in the exhaust chamber 10, which induce to a buffer for the air exhaustion. Thus, the mini-exhaust static pressure controlling apparatus confines the tool contamination and provides a smooth way to draw out pollution without increasing impact to the tool running condition.

The mini-exhaust static pressure controlling apparatus can be employed in an exhaust system in a foundry. In a process area 50 as shown in FIG. 1, for example, the above-mentioned mini-exhaust static pressure controlling apparatus can be disposed at the exhaust outlet of the process area 50 to perform static pressure control.

Figure 4:
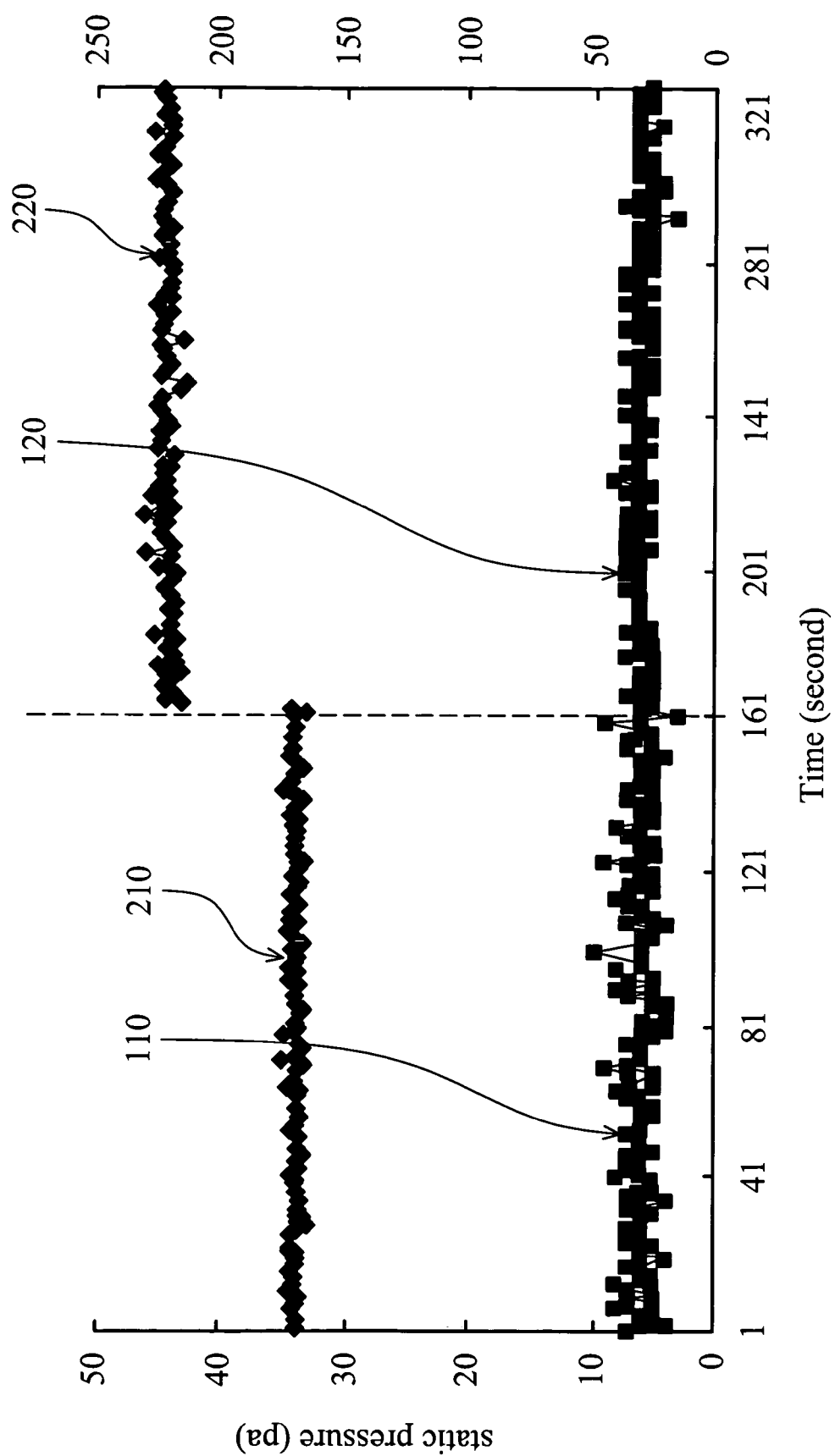
FIG. 4 is a chart of performance of the mini-exhaust static pressure controlling apparatus in FIG. 2.

FIG. 4 shows a chart of performance of the mini-exhaust static pressure controlling apparatus of the embodiment of FIG. 2. On the left part of the chart, the static pressure shown in dotted line 210 in the exhaust chamber 10 is set in 170 Pa. On the right part of the chart, the static pressure in the exhaust chamber 10 shown in dotted line 220 is set in 220 Pa. It is obvious that with the mini-exhaust static pressure controlling apparatus, the static pressure in the exhaust chamber 10 can be adjusted by the auto release damping device 20, and the tool contamination, shown as dotted lines 110 and 120, remains consistent. As a result, there is no requirement using chemical filters in the exhaust system, and cost of the exhaust system is reduced.

While the invention has been described by way of example and in terms of preferred embodiments, it is to be understood that the invention is not limited thereto. To the contrary, it is intended to cover various modifications and similar arrangements (as would be apparent to those skilled in the art) Therefore, the scope of the appended claims should be accorded the broadest interpretation so as to encompass all such

What is claimed is:

1. A mini-exhaust static pressure controlling apparatus for controlling a process area, comprising:
    an exhaust chamber comprising an exterior wall and an air inlet connected to the process area receiving air exhaust from the process area, and an air outlet venting the air exhaust; and
    an auto release damping device disposed on the exterior wall to control static pressure of the air exhaust in the exhaust chamber, the auto release damping device comprising a diaphragm pre-stressed in an arc shape with a coefficient of elasticity and an adjusting device between the exterior wall and the diaphragm;
    wherein the adjusting device applies a stress on the diaphragm to maintain the arc shape of the diaphragm.

2. The mini-exhaust static pressure controlling apparatus as claimed in claim 1, wherein the adjusting device comprises a screwing device.

3. The mini-exhaust static pressure controlling apparatus as claimed in claim 1, wherein the static pressure of the air exhaust in the exhaust chamber is under room pressure.

4. An exhaust system in a foundry, comprising:
    a process area comprising a tool disposed therein, an exhaust inlet, and an exhaust outlet; and
    a mini-exhaust static pressure controlling apparatus disposed at the exhaust outlet, wherein the mini-exhaust static pressure controlling apparatus comprising:
    an exhaust chamber comprising an exterior wall and an air inlet connected to the process area receiving air exhaust from die process area, and an air outlet venting the air exhaust; and
    an auto release damping device disposed on the exterior wall to control static pressure of the air exhaust in the exhaust chamber, the auto release damping device comprising a diaphragm pre-stressed in an arc shape with a coefficient of elasticity and an adjusting device between the exterior wall and the diaphragm;
    wherein the adjusting device applies a stress on the diaphragm to maintain the arc shape of the diaphragm.

5. The exhaust system as claimed in claim 4, wherein the adjusting device comprises a screwing device.

6. The exhaust system as claimed in claim 4, wherein the static pressure of the air exhaust in the exhaust chamber is under room pressure.

7. A method of static pressure controlling for a process area, comprising:
    providing an exhaust chamber on an exhaust outlet of the process area, receiving air exhaust from the process area;
    providing an auto release damping device on an exterior wall of the exhaust chamber, the auto release damping device comprising a diaphragm pre-stressed in an arc shape with a coefficient of elasticity and an adjusting device between the exterior wall and the diaphragm, wherein the adjusting device applies a stress on the diaphragm to maintain the arc shape of the diaphragm; and
    controlling static pressure of the air exhaust in the exhaust chamber by adjusting the adjusting device.

8. The method as claimed in claim 7, wherein the adjusting device comprises a screwing device.

9. The method as claimed in claim 7, wherein the static pressure of the air exhaust in the exhaust chamber is under room pressure. modifications and similar arrangements.

* * * * *